United States Patent
Sater

(10) Patent No.: US 8,293,079 B2
(45) Date of Patent: Oct. 23, 2012

(54) ELECTROLYSIS VIA VERTICAL MULTI-JUNCTION PHOTOVOLTAIC CELL

(75) Inventor: Bernard L. Sater, Strongsville, OH (US)

(73) Assignee: MH Solar Co., Ltd., Taipei (TW)

( * ) Notice: Subject to any disclaimer, the term of this patent is extended or adjusted under 35 U.S.C. 154(b) by 351 days.

(21) Appl. No.: 12/536,992

(22) Filed: Aug. 6, 2009

(65) Prior Publication Data

US 2010/0051472 A1  Mar. 4, 2010

Related U.S. Application Data

(60) Provisional application No. 61/092,531, filed on Aug. 28, 2008.

(51) Int. Cl.
*C25B 9/18* (2006.01)

(52) U.S. Cl. .......................... 204/267; 136/252; 205/628

(58) Field of Classification Search .................. 204/267; 205/628; 136/252
See application file for complete search history.

(56) References Cited

U.S. PATENT DOCUMENTS

| | | |
|---|---|---|
| 4,021,323 A | 5/1977 | Kilby et al. |
| 4,046,594 A | 9/1977 | Tarui et al. |
| 4,082,570 A | 4/1978 | House et al. |
| 4,090,213 A | 5/1978 | Maserjian et al. |
| 4,193,081 A | 3/1980 | Kaplow et al. |
| 4,272,641 A | 6/1981 | Hanak |
| 4,332,973 A | 6/1982 | Sater |
| 4,379,943 A | 4/1983 | Yang et al. |
| 4,381,233 A * | 4/1983 | Adachi et al. ................. 204/242 |
| 4,409,422 A | 10/1983 | Sater |
| 4,516,314 A | 5/1985 | Sater |
| 4,516,317 A | 5/1985 | Bailey |
| 4,634,641 A | 1/1987 | Nozik |
| 4,643,817 A | 2/1987 | Appleby |
| 4,714,510 A | 12/1987 | Holt |
| 4,996,577 A | 2/1991 | Kinzer |
| 5,057,163 A | 10/1991 | Barnett et al. |
| 5,067,985 A | 11/1991 | Carver et al. |
| 5,244,509 A | 9/1993 | Arao et al. |
| 5,261,969 A | 11/1993 | Stanbery |
| 5,437,734 A | 8/1995 | Matsushita et al. |
| 5,667,597 A | 9/1997 | Ishihara |
| 5,716,459 A | 2/1998 | Chang et al. |
| 5,871,591 A | 2/1999 | Ruby et al. |
| 6,028,327 A | 2/2000 | Mizoguchi et al. |
| 6,583,350 B1 | 6/2003 | Gee et al. |
| 2002/0100836 A1 | 8/2002 | Hunt |
| 2003/0015700 A1 | 1/2003 | Eisenbeiser et al. |
| 2004/0200523 A1 | 10/2004 | King et al. |
| 2004/0261840 A1 | 12/2004 | Schmidt et al. |
| 2004/0262154 A1 * | 12/2004 | Gibson et al. ................. 204/280 |

(Continued)

OTHER PUBLICATIONS

Office Action dated May 27, 2011 for U.S. Appl. No. 12/535,952, 21 pages.

(Continued)

*Primary Examiner* — Nicholas A. Smith
(74) *Attorney, Agent, or Firm* — Turocy & Watson, LLP

(57) ABSTRACT

Systems and methods that employ a vertical multi junction (VMJ) photovoltaic cell, to provide electrolysis for water and generate hydrogen and oxygen. Electrical current generated by the VMJ flows through the electrolyte (e.g., salt water) for a decomposition thereof (e.g., hydrogen and oxygen)—whenever threshold voltage of electrolysis operation is reached (e.g., 1.6 volts for water electrolysis).

20 Claims, 8 Drawing Sheets

U.S. PATENT DOCUMENTS

| | | |
|---|---|---|
| 2005/0176164 A1 | 8/2005 | Gee et al. |
| 2005/0194041 A1* | 9/2005 | Fan et al. .................... 136/291 |
| 2005/0211290 A1 | 9/2005 | Deng et al. |
| 2006/0021565 A1 | 2/2006 | Zahler et al. |
| 2007/0151599 A1 | 7/2007 | Cousins |
| 2008/0017243 A1 | 1/2008 | De Ceuster et al. |
| 2008/0048102 A1 | 2/2008 | Kurtz |
| 2008/0173349 A1 | 7/2008 | Liu et al. |

OTHER PUBLICATIONS

Office Action dated May 2, 2011 for U.S. Appl. No. 12/536,987, 21 pages.

Office Action dated Feb. 17, 2011 for U.S. Appl. No. 12/536,982, 25 pages.

Office Action dated Nov. 9, 2011 for U.S. Appl. No. 12/535,952, 18 pages.

Office Action dated Aug. 25, 2011 for U.S. Appl. No. 12/536,982, 19 pages.

Sater, et al. High Voltage Silicon VMJ Solar Cells for up to 1000 Suns Intensities. Photovoltaic Specialists Conference 2002. Conference Record of the Twenty-Ninth IEEE, May 19-24, 2002, pp. 1019-1022 Last accessed Oct. 1, 2009, 4 pages.

Bifacial concentration on VMJ cell. http://www.ioserver.com/fresnelx/vmj.htm. Last accessed Nov. 14, 2009, 3 pages.

Overview of "The eeelluminator Conference" http://www.e3energy.org/vol2no4.pdf. Last accessed Nov. 17, 2009, 9 pages.

Miller et al. "Design Considerations for a Hybrid Amorphous Silicon/Photoelectrochemical Multijunction Cell for Hydrogen Production" http://www.hnei.hawaii.edu/docs/PEC/ICAM_2001.pdf. Last accessed Nov. 17, 2009, 11 pages.

Hovel. "Novel Materials and Devices for Sunlight Concentrating Systems," IBM J. Res Develop, pp. 112-121, vol. 22, No. 2 (1978).

Geisz, et al. "In situ Stress Measurement for MOVPE Growth of High Efficiency Lattice-mismatched Solar Cells.", Journal of Crystal Growth 310 (2008) pp. 2339-2344.

Guo, et al. Edge Passivation for Small-Area, High-Efficiency Solar Cells. 22nd European Photovoltaic Solar Energy Conference, Sep. 3-7, 2007, pp. 1348-1351.

Written Opinion and International Search Report Mailed Jan. 8, 2010 for Application No. PCT/US 09/053576, 21 pages.

Office Action dated Feb. 6, 2012 for U.S. Appl. No. 12/536,982, 22 pages.

Office Action dated Mar. 16, 2012 for U.S. Appl. No. 12/535,952, 20 pages.

* cited by examiner

ELECTROLYSIS VIA VERTICAL MULTI-JUNCTION PHOTOVOLTAIC CELL

CROSS REFERENCE TO RELATED APPLICATIONS

This application claims the benefit of U.S. Provisional Application No. 61/092,531 filed on 28 Aug. 2008 entitled "ELECTROLYSIS VIA VERTICAL MULTI-JUNCTION SOLAR CELL" the entirety of this application is hereby incorporated by reference.

BACKGROUND

Limited supply of fossil energy resources and their associated global environmental damage have compelled market forces to diversify energy resources and related technologies. One such resource that has received significant attention is generating energy through electrolysis of water.

As such, extraction of hydrogen from water continues to attract substantial attention as a clean form of energy (e.g., for fuel cells). In general, electrolysis of water can be obtained by passing direct current from a battery through a water container, wherein presence of acid/base salts increases the reaction intensity. Using platinum electrodes, hydrogen gas will bubble up at the cathode, and oxygen will bubble at the anode. If other metals are used as the anode, there is a chance that the oxygen will react with the anode instead of being released as a gas, or that the anode will dissolve. For example, using iron electrodes in a sodium chloride solution electrolyte, iron oxides will be produced at the anode. With zinc electrodes in a sodium chloride electrolyte, the anode will dissolve, producing zinc ions ($Zn^{2+}$) in the solution, and no oxygen will be formed. When producing large quantities of hydrogen, the use of reactive metal electrodes can significantly contaminate the electrolytic cell—which is why iron electrodes are not usually used for commercial electrolysis. Moreover, electrodes fabricated from stainless steel can be used because they will not react with the oxygen.

Accordingly, solar hydrogen generation represents a promising long-term objective for the energy industry. Moreover, efficient, low-cost methods of generating hydrogen from renewable solar energy remains an important element of the future hydrogen economy. With clean and abundant, photo-electrochemical, or photocatalytic hydrogen generation could become viable technologies. However, to make this a reality, it is necessary to reduce costs, increase efficiency, and improve service life.

For current solar photovoltaic cell-driven electrolysis, the overall efficiency is the product of the efficiency of the photovoltaic cell and the efficiency of the electrolyzer. Photovoltaic cell efficiencies have been reported from 6% to as high as 32% with different materials. Current electrolyzer efficiency is approximately 75%. Hence photovoltaic cell-driven electrolysis efficiency could be from 4.5 to 24%, while in practice values at the low end of this range are encountered. Such low efficiencies are in part due to efficiency losses from sunlight absorption by a liquid electrolyte layer, impediments to the departure of product gases from the photo electrodes due to electrolyte surface tension, and high over potential of the photo electrodes. In addition, system life is limited by photo corrosion and electrochemical corrosion of the electrode. Further, costs of such devices remain too high for wide use.

SUMMARY

The following presents a simplified summary in order to provide a basic understanding of some aspects of the claimed subject matter. This summary is not an extensive overview. It is not intended to identify key/critical elements or to delineate the scope of the claimed subject matter. Its sole purpose is to present some concepts in a simplified form as a prelude to the more detailed description that is presented later.

The subject innovation employs a vertical multi junction (VMJ) photovoltaic cell, to provide electrolysis for compounds (e.g., water), via incident lights and current generation for an electrolysis thereof (e.g., generation of hydrogen and oxygen). Such VMJ includes a plurality of cell units in contact with the electrolyte, wherein each cell unit employs several active layers (e.g., three) to form a PN junction and a "built-in" electrostatic drift field (which enhances minority carrier movement toward the PN junction.) The VMJ can be partially or totally submerged within water/electrolytes, as part of a transparent housing such as glass or plastic, wherein as light encounters such VMJ a plurality of electrolysis electrodes (anodes/cathodes) can be formed through out the VMJ. Current flowing among such electrolysis electrodes flows through the water and decompose the water to hydrogen and oxygen, whenever threshold voltage of electrolysis is reached. Typically, such decomposition threshold voltage lies within a range of 1.18 volts to 1.6 volt to split the water and create hydrogen and oxygen. It is to be appreciated that higher voltages can be reached through the stacked plurality of cell units (e.g., a plurality of cells connected in series). In addition, catalyst additives can further be employed to increase hydrogen and oxygen evolution efficiency, and reduce semiconductor corrosion caused by high electrode potential and the electrolyte solutions. Moreover, the electrolyte can be formed of any solution that does not adversely affect stacked layers that form the VMJ cell (e.g., iridium-based material made of iridium, a binary alloy thereof, or an oxide thereof.)

In a related aspect, the VMJ is partially or totally submerged in the water/electrolyte, and can include raised metal areas (e.g., VMJ electrodes) that protrude above the silicon of the VMJ cell to increase contact area with the water and electrolyte, and enhance hydrogen production. Such protrusions can be of several millimeters, for example. According to a further aspect, substantially thin layers of electro-catalyst materials, such as platinum, $RuO_2$, or titanium, can be incorporated in to the metallization during VMJ cell fabrication to enhance the formation of hydrogen. Moreover, considerable flexibility exists in choosing electro-catalyst material since the n+ negative (−) side of the metallization can be different from that for the p+ positive (+) side. It is to be appreciated that one skilled in the art can readily select catalyst materials that will enhance hydrogen production and are stable and compatible with VMJ cell fabrication. Moreover, ultrasonic units can be employed to free the generated oxygen or hydrogen bubbles that remain attached to electrolysis electrodes. It is to be appreciated the flow of the electrolyte can also remove such formed bubbles.

According to a related methodology, the electrolyte solution is introduced into a container that contains the VMJ, wherein it is fully or substantially immersed. Such system is then subjected to incident light and a current flow generated from the VMJ. The incident light on the VMJ can generate electric current throughout the electrolyte solution, and any location wherein a threshold for decomposing water is reached or passes (e.g., around 1.6 volts) electrolysis of water occurs. For example, across each unit cell a voltage of 0.6 volts can be generated (e.g., for a 1000 suns) and between regions of a first unit cell and a third unit cell electrolysis can occur. Accordingly, various collection mechanisms (e.g., membranes, sieved plates, and the like) to collect the generated oxygen and hydrogen gas, can be positioned between regions that voltage exceed the threshold for water electrolysis (e.g., around 1.6 volts) and decomposition of water is expected. It is to be appreciated that such collection mechanisms can also be positioned in the downstream flow of the electrolyte to collect generated oxygen and hydrogen gases.

To the accomplishment of the foregoing and related ends, certain illustrative aspects (not to scale) of the claimed subject matter are described herein in connection with the following description and the annexed drawings. These aspects are indicative of various ways in which the subject matter may be practiced, all of which are intended to be within the scope of the claimed subject matter. Other advantages and novel features may become apparent from the following detailed description when considered in conjunction with the drawings.

DETAILED DESCRIPTION

The various aspects of the subject innovation are now described with reference to the annexed drawings, wherein like numerals refer to like or corresponding elements throughout. It should be understood, however, that the drawings and detailed description relating thereto are not intended to limit the claimed subject matter to the particular form disclosed. Rather, the intention is to cover all modifications, equivalents, and alternatives falling within the spirit and scope of the claimed subject matter.

Figure 1:
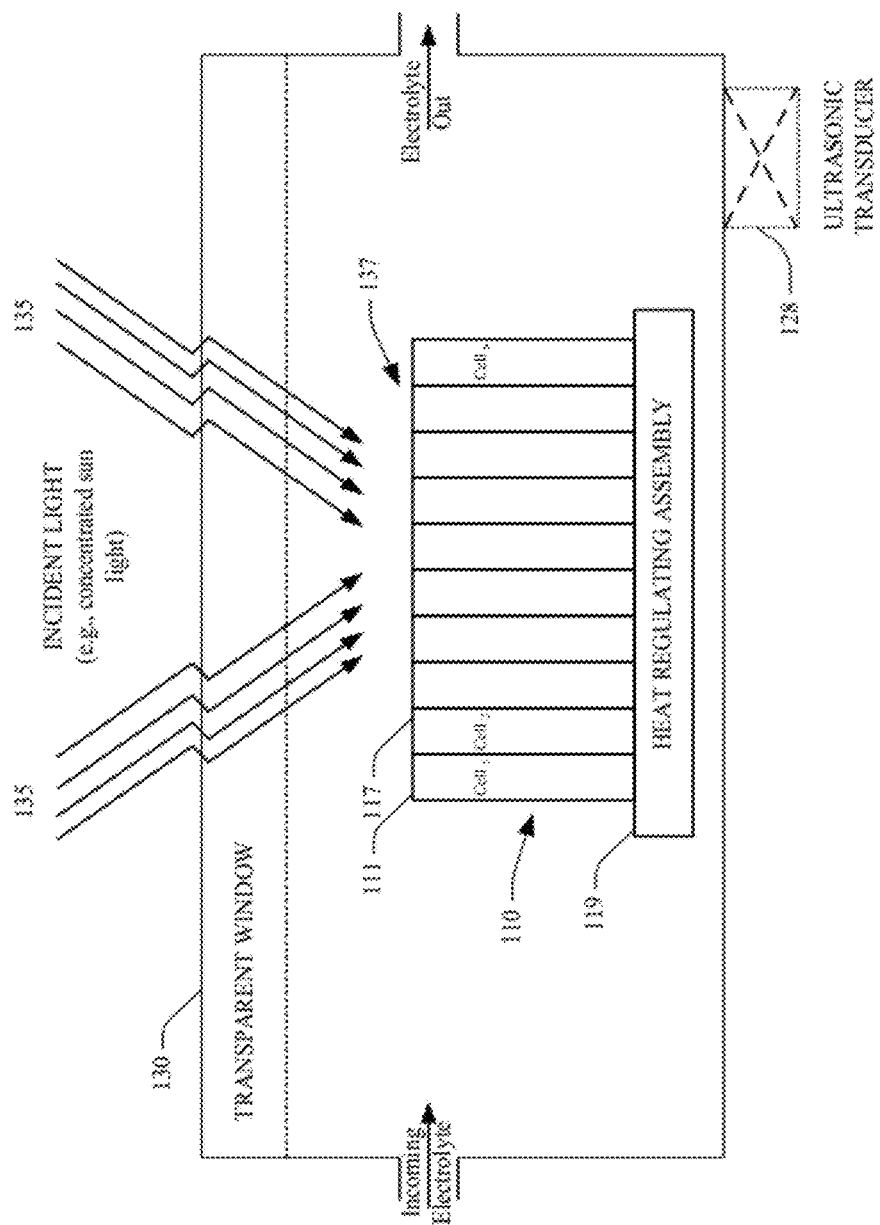
FIG. 1 illustrates a schematic block diagram of an electrolysis system that employs a vertical multi junction (VMJ) cell for water electrolysis in accordance with an aspect of the subject innovation.

FIG. 1 illustrates a schematic block diagram of an electrolysis system that employs a vertical multi junction (VMJ) cell 110 for electrolysis in accordance with an aspect of the subject innovation. The VMJ 110 can be partially or totally submerged within water/electrolytes, as part of a transparent housing such as quartz, glass or plastic 130. As incident light 135 encounters a surface 137 of such VMJ 110 a plurality of electrolysis electrodes in form of anodes and/or cathodes can be formed throughout the VMJ, and/or on a surface 137 thereon. Current flowing among such electrolysis electrodes that are formed on the surface 137, then flows through the water and decompose the water to hydrogen and oxygen—whenever threshold voltage of electrolysis is reached. The VMJ 110 includes a plurality of integrally bonded cell units 111, 117 (1 to n, where n is an integer), wherein each cell unit itself is formed from stacked substrates or layers (not shown). For example, each cell unit 111, 117 can include a plurality of parallel semiconductor substrates stacked together, and consisting of impurity doped semiconductor material, which form a PN junction and a "built-in" electrostatic drift field that enhance minority carrier movement toward such PN junction. When incident light 135 is directed to the surface 137, in various regions of the VMJ 110, then a plurality of cathodes and anodes can be formed that subsequently function as electrodes for the electrolysis operation.

Current flowing among such electrolysis electrodes flows through the electrolyte and decompose the water to hydrogen and oxygen, whenever threshold voltage of electrolysis is reached. Typically, such decomposition threshold voltage lies within a range of 1.18 volts to 1.6 volt to split the water and create hydrogen and oxygen. It is to be appreciated that higher voltages can be reached through the stacked plurality of cell units (e.g., a plurality of cells connected in series). In addition, catalyst material can further be employed to increase hydrogen and oxygen evolution efficiency and reducing semiconductor corrosion caused by high electrode potential and electrolyte solutions. Moreover, the electrolyte can be formed of any solution that does not adversely affect stacked layers that form the VMJ cell (e.g., iridium-based catalyst made of iridium, a binary alloy thereof, or an oxide thereof.) In related aspects, ultrasonic transducers can operatively interact with the electrolysis system to free oxygen or hydrogen bubbles, which remain attached to the electrolysis electrodes.

The VMJ 110 can further be positioned on a heat regulating assembly 119, which removes generated heat from hot spot areas to maintain temperature gradient for the VMJ cell within predetermined levels. Such heat regulating assembly 119 can be in form of a heat sink arrangement, which includes a plurality of heat sinks to be surface mounted to a back side of the VMJ, wherein each heat sink can further include a plurality of fins (not shown) extending substantially perpendicular the back side. The fins can expand a surface area of the heat sink to increase contact with cooling medium (e.g., electrolyte, cooling fluid such as water), which can be further employed to dissipate heat from the fins and/or photovoltaic cells. As such, heat from the VMJ can be conducted through the heat sink and into surrounding electrolyte, and/or substance that does not affect electrolysis operation. Moreover, heat from the VMJ cell can be conducted through thermal conducting paths (e.g., metal layers), to the heat sinks to mitigate direct physical or thermal conduct of the heat sinks to the VMJ cells, and provide a scalable solution for proper operation of the electrolysis.

Figure 2:
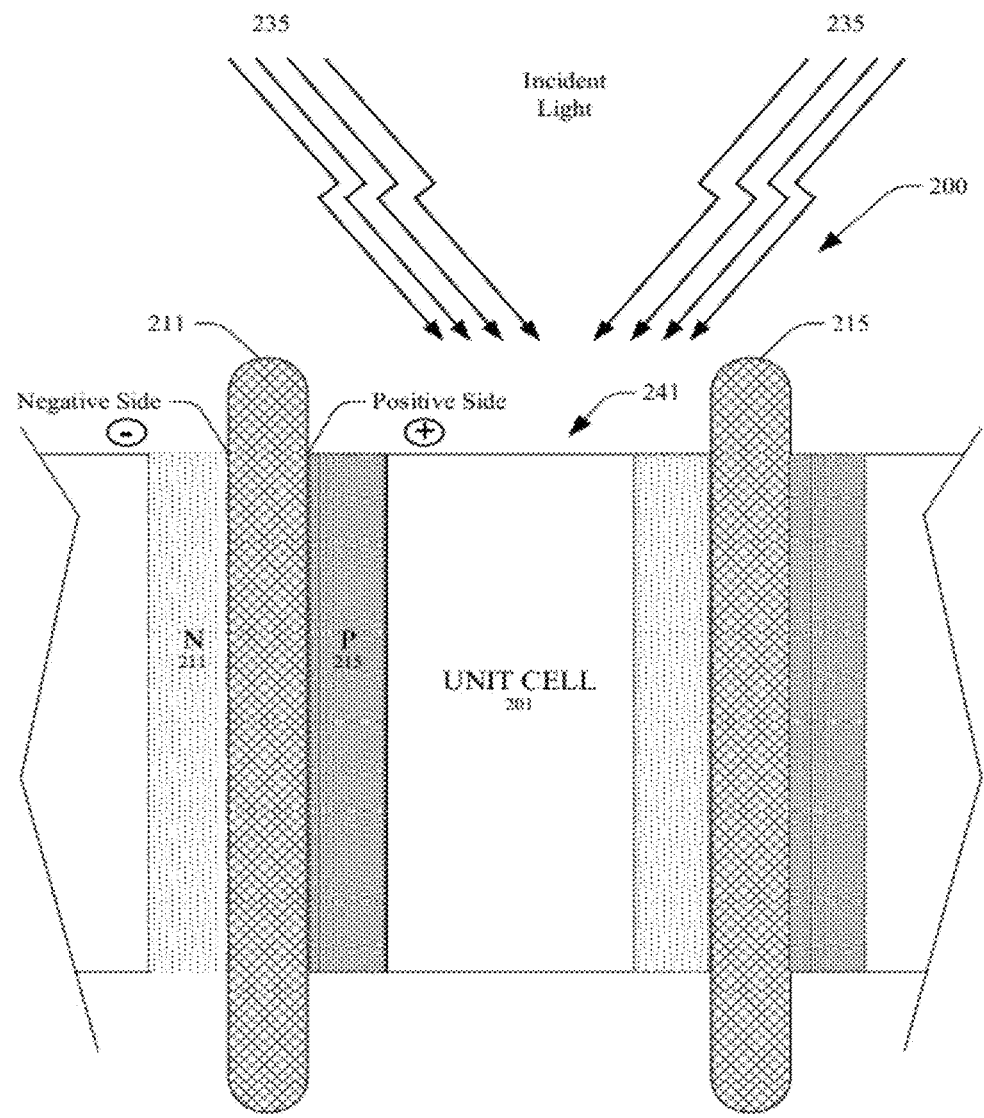
FIG. 2 illustrates protrusions of metal layers from a surface of the VMJ that can facilitate the electrolysis process.

In a related aspect, the heat sinks can be positioned in a variety of planar or three dimensional arrangements as to monitor, regulate and over all manage heat flow away from the VMJ cell. Moreover, each heat sink can further employ thermo/electrical structures (not shown) that can have a shape of a spiral, twister, corkscrew, maze, or other structural shapes with a denser pattern distribution of lines in one portion and a relatively less dense pattern distribution of lines in other portions. For example, one portion of such structures can be formed of a material that provides relatively high isotropic conductivity and another portion can be formed of a material that provides high thermal conductivity in another direction. Accordingly, each thermo/electrical structure of the heat regulating assembly provides for a heat conducting path that can dissipate heat from the hot spots and into the various heat conducting layers, or associated heat sinks, of the heat regulating device, and hence facilitate the electrolysis operation. It is to be appreciated that the heat sinks can be cooled via an independent cooling medium that is separate from the electrolyte medium FIG. 2 illustrates a further aspect of the subject innovation that includes protrusions 211, 215 of metal layers that are associated with electrodes of a single unit cell 201. Such protrusions 211, 215 protrude (e.g., several millimeters) from a surface 241 of the VMJ 200 to facilitate the electrolysis process, via increasing a contact surface area. In addition, substantially thin layers of electro-catalyst materials, such as platinum, $RuO_2$, or titanium, can be incorporated in to the metallization during VMJ cell fabrication to enhance hydrogen production. Moreover, considerable flexibility exists in choosing electro-catalyst material since the n negative (−) side 211 of the metallization can be different from that for the p+ positive (+) side 215. It is to be appreciated that one skilled in the art can readily select catalyst materials that will enhance hydrogen production and are stable and compatible with VMJ cell fabrication. As incident light 235 reaches the surface 241 of the VMJ, a plurality of cathodes/anodes can be formed thereon. For example, in regions on the VMJ at the negatively charged cathode, a reduction reaction takes place, with electrons (e⁻) from the cathode being given to hydrogen captions to form hydrogen gas (the half reaction balanced with acid):

Cathode (reduction): $2H^+(aq)+2e^-\rightarrow H_2(g)$ electrons (e⁻) from the cathode being given to hydrogen captions to form hydrogen gas (the half reaction balanced with acid).

At the positively charged anode, an oxidation reaction occurs, generating oxygen gas and giving electrons to the cathode to complete the circuit:

Anode (oxidation): $2H_2O(l)\rightarrow O_2(g)+4H^+(aq)+4e^-$

The same half reactions can also be balanced with base as listed below. In general, not all half reactions should be balanced with acid or base. In general, to add half reactions they typically should both be balanced with either acid or base.

Cathode (reduction): $2H_2O(l)+2e^-\rightarrow H_2(g)+2OH^-(aq)$

Anode (oxidation): $4OH^-(aq)\rightarrow O_2(g)+2H_2O(l)+4e^-$

Combining either half reaction pair yields the same overall decomposition of water into oxygen and hydrogen:

Overall reaction: $2H_2O(l)\rightarrow 2H_2(g)+O_2(g)$

As indicated above, the number of hydrogen molecules produced is thus twice the number of oxygen molecules. Assuming equal temperature and pressure for both gases, the produced hydrogen gas has therefore twice the volume of the produced oxygen gas. The number of electrons pushed through the water is twice the number of generated hydrogen molecules and four times the number of generated oxygen molecules. As explained earlier, if a water-soluble electrolyte is added, the conductivity of the water rises considerably. Accordingly, the electrolyte disassociates into captions and anions; wherein the anions rush towards the anode and neutralize the buildup of positively charged H⁺ therein; similarly, the captions rush towards the cathode and neutralize the buildup of negatively charged OH therein. Such allows the continued flow of electricity. It is to be appreciated that the choice of electrolyte should be considered in conjunction with the material employed for the VMJ cell, as not to adversely affect its material and operation. Additional factors in choosing an electrolyte pertain to the fact that an anion from the electrolyte is in competition with the hydroxide ions to give up an electron. An electrolyte anion with less standard electrode potential than hydroxide will likely be oxidized instead of the hydroxide, and hence no oxygen gas will be produced. Likewise, a cation with a greater standard electrode potential than a hydrogen ion will be reduced, and no hydrogen gas will be produced. To mitigate such circumstances, the following captions have lower electrode potential than H⁺ and are therefore suitable for use as electrolyte captions: Li⁺, Rb⁺, K⁺, Cs⁺, Ba²⁺, Sr²⁺, Ca²⁺, Na⁺, and Mg²⁺. Sodium and lithium can also be used, if so does not adversely affect the VMJ cell—as they form inexpensive, soluble salts.

Figure 3:
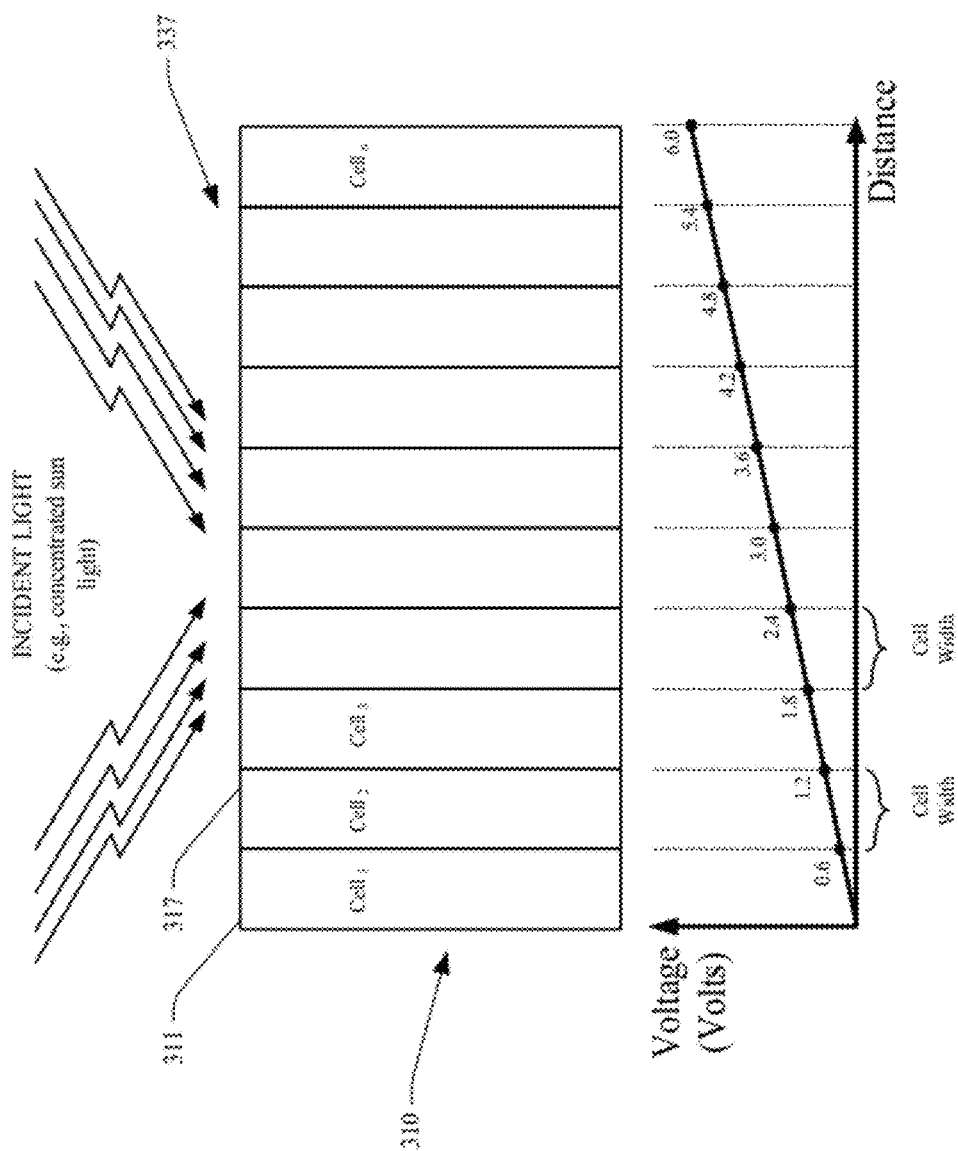
FIG. 3 illustrates a voltage gradient across the VMJ and throughout the stacked cells as part thereof.

FIG. 3 illustrates a voltage-distance graph for various points on the VMJ 310, wherein the unit cells 311, 317 intersect or share a common boundary. As illustrated, the VMJ 310 includes a plurality of unit cells 311, 317 that are serially connected, wherein the voltage can increase as a linear function of number of cells that are stacked together (e.g., from left to right on the horizontal axis). As illustrated in FIG. 3, voltage difference between both ends of cell, is 0.6 volts, and by stacking cell 2 thereon, such voltage difference in the combined cells is increased to 1.2 volts. Likewise, by stacking cell ₃ thereon, the voltage difference can be increased to 1.8 volts. As such, electrolysis can occur between any two points on a surface of the VMJ that exceeds the threshold value for decomposing the water. For example, for an open circuit voltage of a 40 junction VMJ cell at 1000 suns 32 volts can be generated (e.g., 0.8 volts per unit cell.) Assuming electrolysis in initiated at 1.6 volts only two unit cells are sufficient to provide the voltage. In another aspect, as the current loading increases, the voltage determined by the VMJ cell IV characteristics at maximum power at 1000 suns drops to 24 volts, or 0.6 volts per unit cell. As such, three unit cells can be required, which contribute to 1.8 volts for powering the electrolysis reaction. (Typically an over voltage may also be required for electrolysis at higher current densities.)

It is further to be appreciated that although the electrolysis is described in context of a single VMJ, the subject innovation is not so limited and can be implemented as part of a plurality of VMJ cells (e.g., in parallel and/or series, or operatively separate from each other). By determining current relationships formed among various regions of the VMJ that demonstrate different voltages, one can tailor a VMJ cell design to provide additional contacting area for handling higher currents where needed. For example, the contacting current densities can be reduced by increasing metallization thickness at various points, if so is required. Moreover, various forms of pressurization can be employed to improve electrolysis efficiency and/or collection (e.g., sieving mechanisms, filtering mechanisms, and the like) for products of decompositions (e.g., hydrogen, oxygen). It is to be appreciated that the subject innovation is not limited to electrolysis of water and electrolysis of other compounds that can suitably interact with the VMJ are well within the realm of the subject innovation.

Figure 4:
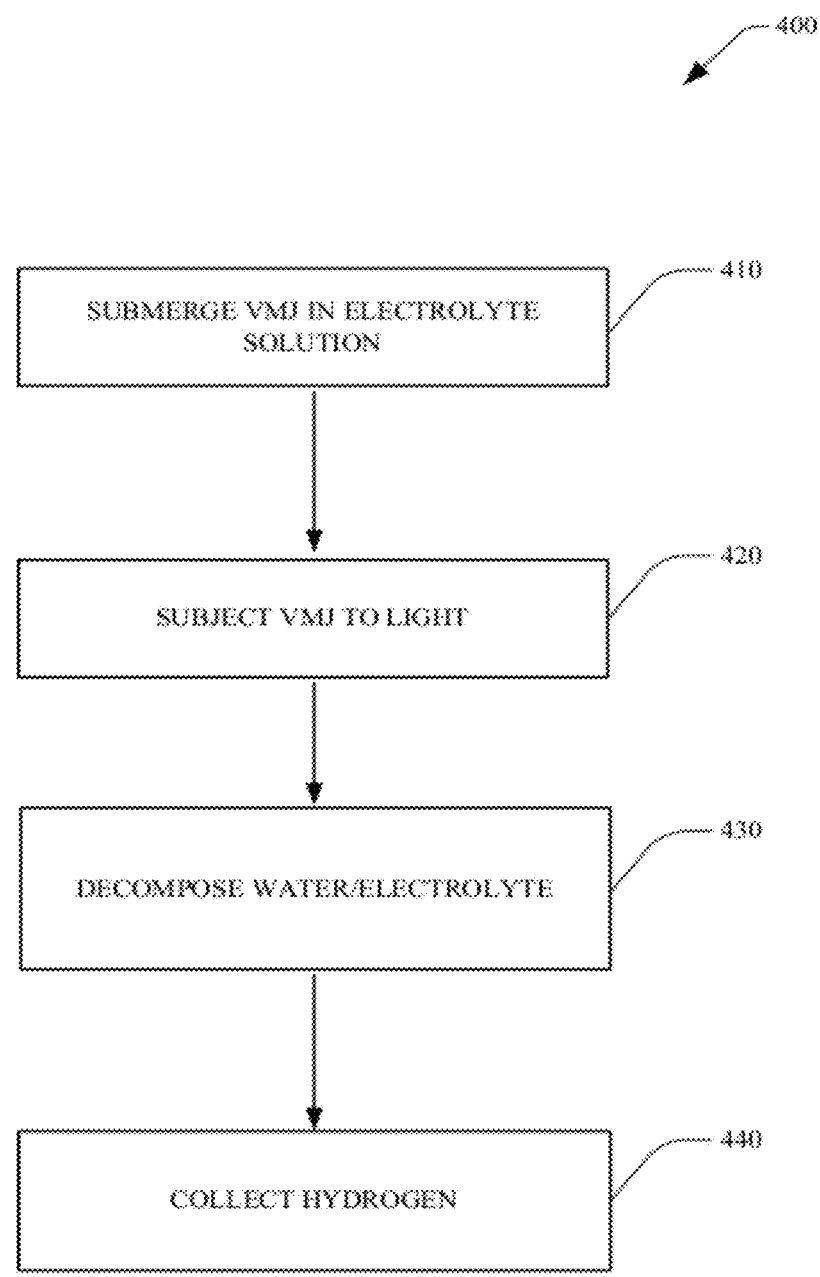
FIG. 4 illustrates a methodology of water electrolysis via a VMJ according to an aspect of the subject innovation.

FIG. 4 illustrates a related methodology 400 of water electrolysis via a VMJ according to an aspect of the subject innovation. While the exemplary method is illustrated and described herein as a series of blocks representative of various events and/or acts, the subject innovation is not limited by the illustrated ordering of such blocks. For instance, some acts or events may occur in different orders and/or concurrently with other acts or events, apart from the ordering illustrated herein, in accordance with the innovation. In addition, not all illustrated blocks, events or acts, may be required to implement a methodology in accordance with the subject innovation. Moreover, it will be appreciated that the exemplary method and other methods according to the innovation may be implemented in association with the method illustrated and described herein, as well as in association with other systems and apparatus not illustrated or described. Initially and at 410, the electrolyte solution is introduced into a container that contains the VMJ, wherein it is fully or substantially immersed. Such system is then subjected to incident light at 420, and a current flow generated from the VMJ. The incident light can generate water electrolysis throughout the electrolyte solution at 430, and any location wherein a threshold for decomposing water is reached or passes (e.g., around 1.2 volts) electrolysis occurs. For example, across each unit cell a voltage of 0.6 volts can be generated (e.g., for a 1000 suns) and between regions of a first unit cell and a third unit cell electrolysis can occur. Accordingly, various collection mechanisms (e.g., membranes, sieved plates, and the like) can be positioned between regions that voltage exceed the threshold for electrolysis (e.g., around 1.6), and hence collect the generated hydrogen gas at 440. It is to be appreciated that other collections mechanisms such as collection down stream can also be employed.

Figure 5:
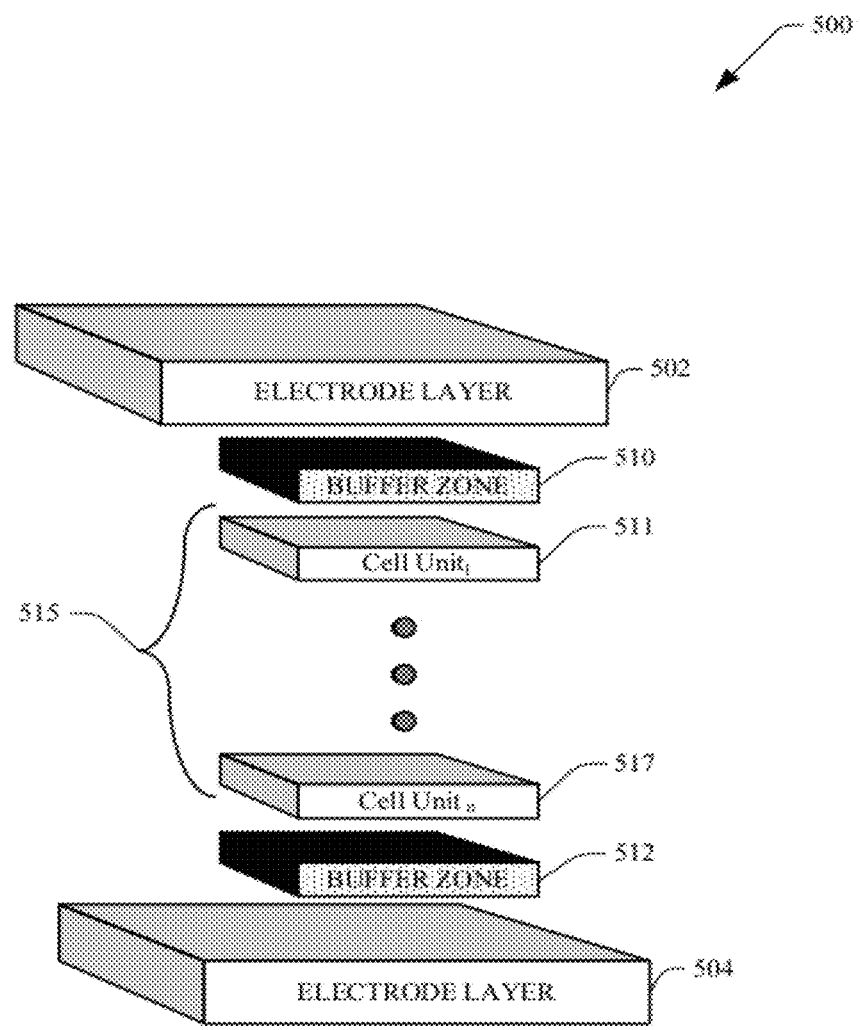
FIG. 5 illustrates a VMJ cell that can be employed for electrolysis of the subject innovation.

FIG. 5 illustrates a VMJ cell that can be employed for electrolysis in accordance with an aspect of the subject innovation. The VMJ 515 itself is formed from a plurality of integrally bonded cell units 511, 517 (1 to n, n being an integer), wherein each cell unit itself is formed from stacked substrates or layers (not shown). For example, each cell unit 511, 517 can include a plurality of parallel semiconductor substrates stacked together, and consisting of impurity doped semiconductor material, which form a PN junction and a "built-in" electrostatic drift field that enhance minority carrier movement toward such PN junction. Moreover, by implementing a buffer zone(s) 510, 512 various active layers such as nn+ and/or p+n junctions located at either ends of a VMJ cell 515 (and as part of cell units thereof) can be safeguarded against adverse forms of stress and/or strain (e.g., thermal/mechanical compression, torsion, moment, shear and the like—which can be induced in the VMJ during fabrication and/or operation thereof.) Each of such buffer zones 510, 512 can be formed via material that have substantially low resistivity ohmic contact (e.g., any range with upper limit less than approximately 0.5 ohm-cm), while mitigating and/or eliminating unwanted auto doping. For example, the buffer zones 510, 512 can be formed by employing low resistivity wafers that are p-type doped, with other p-type dopants such as aluminum alloys, to mitigate a risk of auto-doping (in contrast to employing n-type wafers that can create unwanted pn junctions—when it is desired to create a substantially low resistivity ohmic contact.) Catalytic materials (e.g., platinum, titanium, and the like) can also be employed at end contacts of the VMJ, to facilitate the electrolysis operation, for example.)

Figure 6:
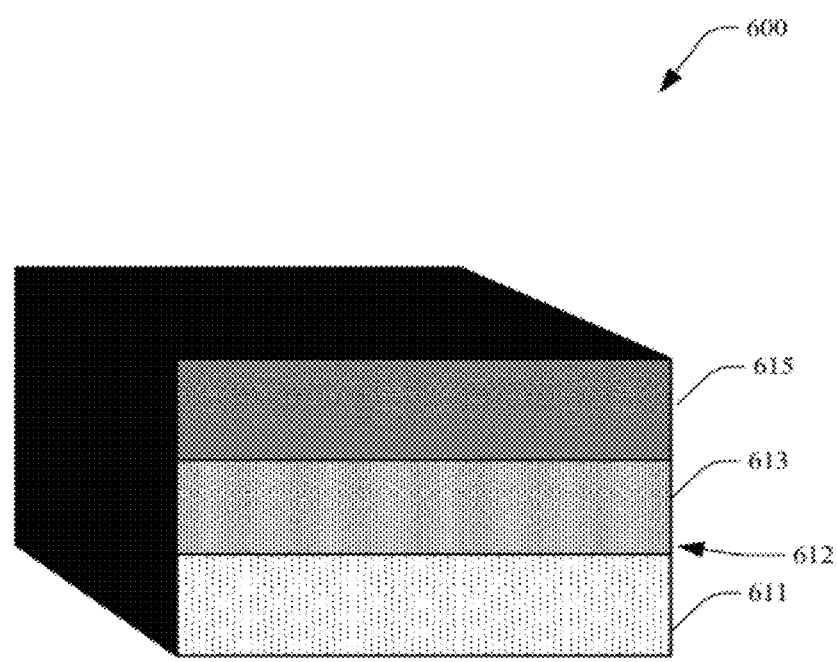
FIG. 6 illustrates a single cell unit, a plurality of which form the VMJ for electrolysis of the subject innovation.

FIG. 6 illustrates a particular aspect of a unit cell 600, an array of which can form a VMJ cell for the electrolysis of the subject innovation. The unit cell 600 includes layers 611, 613, 615 stacked together in a substantially parallel arrangement. Such layers 611, 613, 615 can further include impurity doped semiconductor material, wherein layer 613 is of one conductivity type and layer 611 is of an opposing conductivity type—to define a PN junction at intersection 612. Likewise, layer 615 can be of the same conductivity type as layer 613—yet with substantially higher impurity concentration, hence generating a built-in electrostatic drift field that enhances minority carrier movements toward the PN junction 612. Such unit cells can be integrally bonded together to form a VMJ (e.g., using catalytic material for such bondage to enhance electrolysis), which performs electrolysis as described in detail supra.

According to a further aspect, to fabricate the VMJ from a plurality of cells 600, initially identical PNN+ (or NPP+) junctions can be formed to a depth of approximately 3 to 10 μm inch into flat wafers of high resistivity (e.g., more than 100 ohm-cm) of N type (or P type) silicon—having a thickness of approximately 0.008 inch. Subsequently, such PNN+ wafers are stacked together with a thin layer of aluminum interposed between each wafer, wherein each wafer's PNN+ junction and crystal orientation can be oriented in the same direction. Moreover, aluminum-silicon eutectic alloys can be employed, or metals such as germanium and titanium, or metals such as molybdenum or tungsten that have thermal coefficient(s) that substantially matches the thermal coefficient of silicon can also be employed. Next, the silicon wafers and aluminum alloy interfaces can be alloyed together, such that the stacked assembly can be bonded together (e.g., further including catalytic material.) It is to be appreciated that other material, such as germanium and titanium can also be employed. Likewise, aluminum-silicon eutectic alloys can also be employed. It is further to be appreciated that the electrolyte should be chosen such that it does not adversely affect the operation of the VMJ, and/or result in chemical reactions harmful to the VMJ. It is to be appreciated that various N+-type and P-type doping layer formation can be implemented as part of the cell units and such arrangements are well within the realm of the subject innovation.

Figure 7:
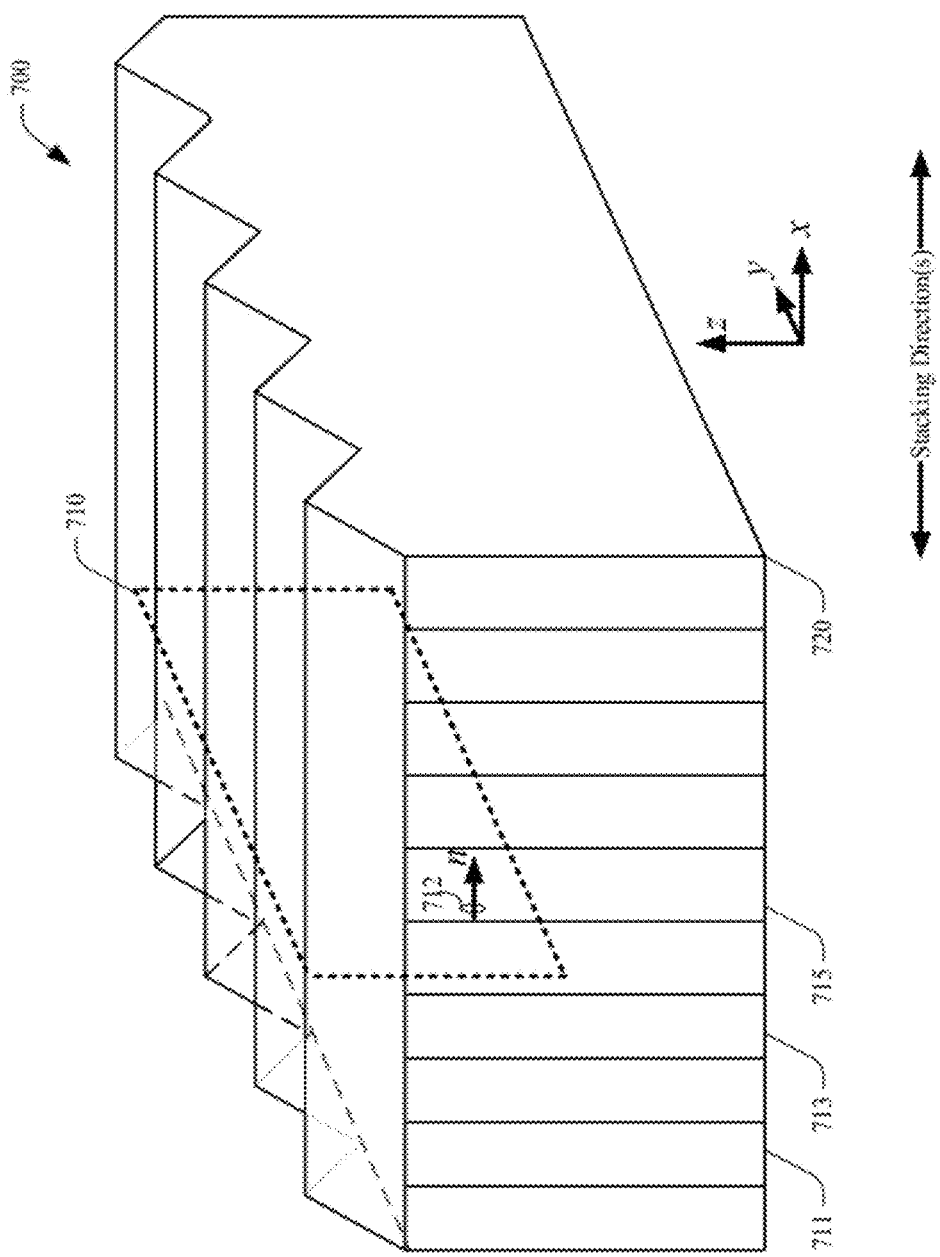
FIG. 7 illustrates a VMJ cell with a grooved surface to improve efficiency of the electrolysis process.

FIG. 7 illustrates a further aspect of the subject innovation that includes a VMJ employed for electrolysis with a textured surface. A schematic perspective of a grooved surface 700 is depicted as part of a vertical multi junction (VMJ) cell 720 in accordance with an aspect of the subject innovation. Such an arrangement for texturing 700 enables the refracted light to be directed away from the p+ and n+ diffused doped regions—while at the same time creating desired carriers. Accordingly, incident light can be refracted in the plane 710 having a normal vector n. Such plane 710 is parallel to the PN junction planes of the VMJ 720, and can include the cross section configuration of the grooves 700. Put differently, the orientation of the plane 710 is substantially perpendicular to the direction of stacking the unit cells 711, 713, 715. Such grooved surface can increase efficiency of the electrolysis process.

Figure 8:
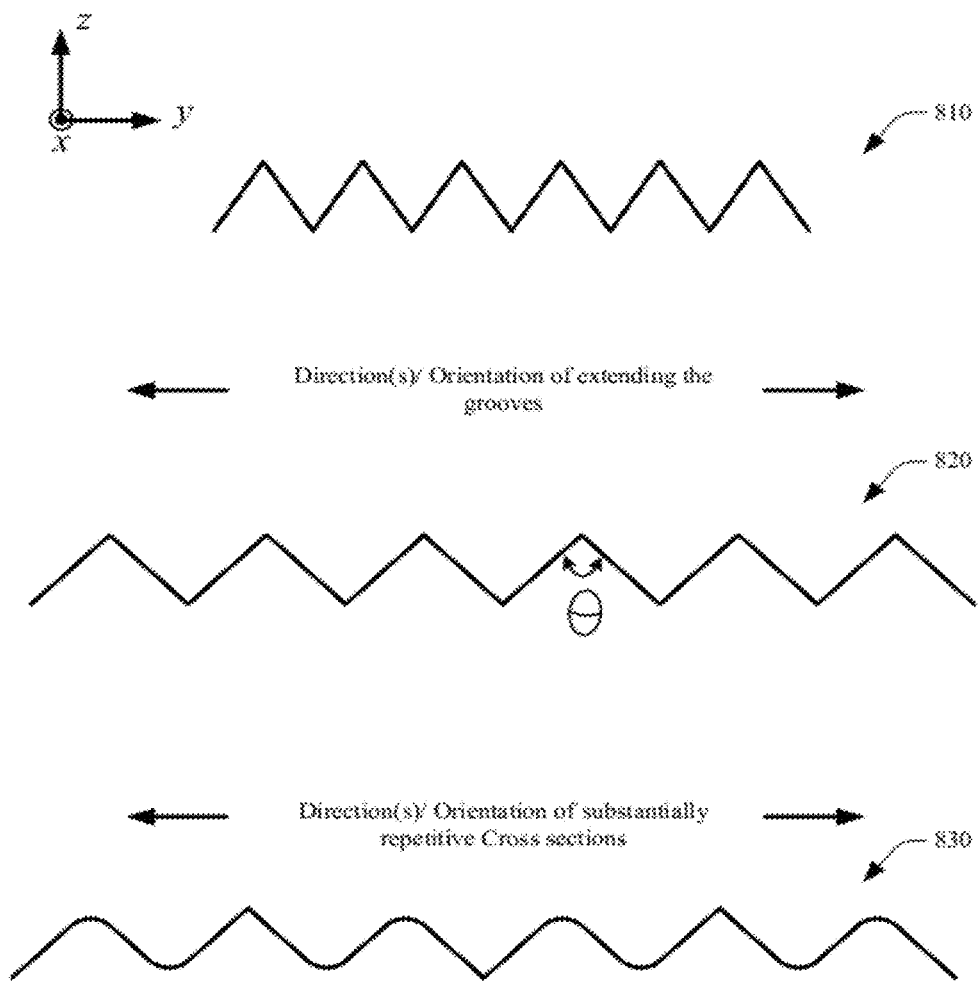
FIG. 8 illustrates exemplary grooving for a surface of a VMJ employed for electrolysis according to an aspect of the subject innovation.

FIG. 8 illustrates exemplary textures for grooving a surface of the VMJ, which receives light thereon for electrolysis of an electrolyte. Such grooving can be in form of cavity shaped grooves—for example, as "V" shaped cross section configurations having a variety of angles θ, (e.g., $0°<\theta<180°$) "U" shaped cross configurations, and the like—wherein the plane that includes the cross section configuration is substantially perpendicular to the direction of stacking the unit cells that form the VMJ, and/or substantially parallel to the PN junctions of the VMJ. It is to be appreciated that the texturing 810, 820, 830 for the VMJ of the subject innovation is different from prior art for conventional silicon photovoltaic cell textures, in orientation of PN junctions and/or interaction with incident light. For example, conventional silicon photovoltaic cells are typically textured to incline the penetration of the light, so that more of the longer wavelengths are absorbed closer to PN junctions (positioned horizontally) for better current collection of carriers—and hence mitigate poor spectral response to longer wavelengths in the solar spectrum. In contrast, such is not required in the VMJ of the subject innovation that includes vertical junctions, and which already provides an enhanced spectral response to the longer wavelengths in the solar spectrum.

Rather, one aspect for implementing grooves of FIG. 7 (e.g., V grooves) is to mitigate bulk recombination losses by reducing the bulk volume—(as opposed to conventional solar surfaces with texturing, which reduce reflection, or cause reflected or refracted light to become closer to the junctions). In particular, VMJ cell has demonstrated better carrier current collection for both the short wavelengths and the long wavelengths, wherein the short wavelength response is due to eliminating a highly doped horizontal junction at the top surface and the long wavelength respond is due to the enhanced collection efficiency of vertical junctions.) As another example, if instead of the cavity shaped grooved texture of the subject innovation, other textures (e.g., random, pyramids, domes, and similar raised configurations) were implemented as part of the VMJ, incident light becomes refracted in all directions, resulting in light absorption in the p+ and n+ diffused regions and hence reduced efficiency. Moreover, reflection coatings can be applied to the back side of the VMJ cell to further enhance light absorption.

What has been described above includes various exemplary aspects. It is, of course, not possible to describe every conceivable combination of components or methodologies for purposes of describing these aspects, but one of ordinary skill in the art may recognize that many further combinations and permutations are possible. Accordingly, the aspects described herein are intended to embrace all such alterations, modifications and variations that fall within the spirit and scope of the appended claims.

Furthermore, to the extent that the term "includes" is used in either the detailed description or the claims, such term is intended to be inclusive in a manner similar to the term "comprising" as "comprising" is interpreted when employed as a transitional word in a claim.

What is claimed is:

1. An electrolysis system comprising: a vertical multi junction (VMJ) photovoltaic cell that includes a plurality of integrally bonded cell units, each cell unit with a plurality of layers that form a PN junction(s); a textured surface of the VMJ photovoltaic cell for receipt of incident light, the textured surface for mitigation of bulk recombination losses for the VMJ photovoltaic cell, the textured surface facilitates confining light refraction of an incident light in a plane that cross sections the textured surface, the plane includes substantially repetitive cross sectional patterns, wherein light absorption is mitigated in p+ and n+ diffused doped regions of the VMJ; an electrolyte that receives a current generated by the VMJ photovoltaic cell, a plurality of anodes and a plurality of cathodes formable by the integrally bonded cell units on a surface of the VMJ, to create the current that decomposes the electrolyte, and a plurality of metal layer protrusions, each protrusion bonded to one of the plurality of anodes and to one of the plurality of cathodes.

2. The electrolysis system of claim 1, the electrolyte is salt water.

3. The electrolysis system of claim 1, each cell units generates at least 0.6 volt.

4. The electrolysis system of claim 1, the VMJ photovoltaic cell has a grooved surface.

5. The electrolysis system of claim 4, the grooved surface is at least one of a V section, or U section, or combination thereof.

6. The electrolysis system of claim 1, each cell of the cell units includes a plurality of parallel semiconductor substrates that are stacked together, wherein a direction of stacking is substantially non-perpendicular to incident light that creates the current.

7. The electrolysis system of claim 6, a substrate includes impurity doped semiconductor material that form a PN junction.

8. The electrolysis system of claim 7 the substrate further includes a "built-in" electrostatic drift field that facilitates minority carrier movement towards the PN junction.

9. The electrolysis system of claim 7 the substrate having a back surface with reflection coatings.

10. The electrolysis system of claim 7 further comprising a buffer zone that safeguards the plurality of layers from at least one of a stress and strain induced on the VMJ photovoltaic cell.

11. The electrolysis system of claim 7, the buffer zone including substantially low resistivity material.

12. A method of electrolyzing an electrolyte comprising: integrally bonding a plurality of active layers to form a VMJ photovoltaic cell; generating a current from the VMJ cell for electrolysis of an electrolyte, forming a plurality of anodes and cathodes that protrude from a surface of the VMJ cell, and forming a plurality of metal layer protrusions, each protrusion bonded to one of the plurality of anodes and to one of the plurality of cathodes.

13. The method of claim 12 further comprising cooling the VMJ cell by a heat regulating assembly.

14. The method of claim 12 further comprising partially submerging the VMJ cell in the electrolyte.

15. The method of claim 12 further comprising
mitigating bulk losses in the VMJ cell via a textured surface of the VMJ cell that receives an incident light; and
confining refracted incident light in a plane that cross sections the textured surface, the plane includes substantially repetitive cross sectional patterns.

16. The method of claim 12 further comprising increasing mechanical stability of the VMJ cell via buffer zones.

17. The method of claim 12, the integrally bonding act further comprising stacking cell units.

18. The method of claim 15 further comprising alloying silicon wafers and aluminum interfaces to form the VMJ cell.

19. The method of claim 15 further comprising employing impurity doped semiconductor material to form PN junctions in the VMJ cell.

20. An electrolysis system comprising: decomposing means for decomposing an electrolyte via incident light comprising a plurality of anodes and cathodes on a surface of the decomposing means and comprising a plurality of metal layer protrusions, each protrusion bonded to one of the plurality of anodes and to one of the plurality of cathodes; and means for mitigating bulk combination losses for the decomposing means, wherein refracted light is substantially confined in a plane that cross sections the means for mitigating bulk combination losses, the plane includes substantially repetitive cross sectional patterns; wherein light absorption is mitigated in p+ and n+ diffused doped regions of the decomposing means.

* * * * *